(12) United States Patent
Yang

(10) Patent No.: US 11,562,800 B2
(45) Date of Patent: Jan. 24, 2023

(54) SYSTEMS AND METHODS FOR COUNTING PROGRAM-ERASE CYCLES OF A CELL BLOCK IN A MEMORY SYSTEM

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 17/343,486

(22) Filed: Jun. 9, 2021

(65) Prior Publication Data

US 2022/0399064 A1    Dec. 15, 2022

(51) Int. Cl.
*G11C 16/06* (2006.01)
*G11C 16/34* (2006.01)
*G11C 16/04* (2006.01)

(52) U.S. Cl.
CPC ...... *G11C 16/3495* (2013.01); *G11C 16/0483* (2013.01)

(58) Field of Classification Search
CPC .................................................. G11C 16/3495
USPC ....................................................... 365/185.09
See application file for complete search history.

(56) References Cited

U.S. PATENT DOCUMENTS

| 8,995,197 B1* | 3/2015 | Steiner ................... | G11C 16/10 365/185.19 |
| 2015/0006792 A1* | 1/2015 | Lee ......................... | G06F 3/065 711/162 |

* cited by examiner

*Primary Examiner* — Hoai V Ho
(74) *Attorney, Agent, or Firm* — Dickinson Wright PLLC; Steven C. Hurles

(57) ABSTRACT

This disclosure proposes a method to save P/E cycling information inside NAND by using 2-byte column in programmable selective devices (e.g., SGD). The proposed method is a one-way programming method, and does not perform an erase operation within the 2-byte column. The proposed methods described herein can reduce the burden of relying upon controller SRAM/DRAM. Additionally, by storing the P/E cycling information in NAND, the P/E cycling is not lost due to a power loss event. At least one application advantageous for using NAND to store P/E cycling information includes wear leveling.

20 Claims, 13 Drawing Sheets

| | $B_{16}$ | $B_{15}$ | $B_{14}$ | $B_{13}$ | $B_{12}$ | $B_{11}$ | $B_{10}$ | $B_9$ | $B_8$ | $B_7$ | $B_6$ | $B_5$ | $B_4$ | $B_3$ | $B_2$ | $B_1$ |
|---|---|---|---|---|---|---|---|---|---|---|---|---|---|---|---|---|
| Cycle 1: 0-255 | 1 | 1 | 1 | 1 | 1 | 1 | 1 | 1 | 1 | 1 | 1 | 1 | 1 | 1 | 1 | 1 |
| Cycle 2: 256-511 | 1 | 1 | 1 | 1 | 1 | 1 | 1 | 1 | 1 | 1 | 1 | 1 | 1 | 1 | 1 | 0 |
| Cycle 3: 512-767 | 1 | 1 | 1 | 1 | 1 | 1 | 1 | 1 | 1 | 1 | 1 | 1 | 1 | 1 | 0 | 0 |
| Cycle 4: 768-1023 | 1 | 1 | 1 | 1 | 1 | 1 | 1 | 1 | 1 | 1 | 1 | 1 | 1 | 0 | 0 | 0 |
| Cycle 5: 1024-1279 | 1 | 1 | 1 | 1 | 1 | 1 | 1 | 1 | 1 | 1 | 1 | 1 | 0 | 0 | 0 | 0 |
| Cycle 6: 1280-1535 | 1 | 1 | 1 | 1 | 1 | 1 | 1 | 1 | 1 | 1 | 1 | 0 | 0 | 0 | 0 | 0 |
| Cycle 7: 1536-1791 | 1 | 1 | 1 | 1 | 1 | 1 | 1 | 1 | 1 | 1 | 0 | 0 | 0 | 0 | 0 | 0 |
| Cycle 8: 1792-2047 | 1 | 1 | 1 | 1 | 1 | 1 | 1 | 1 | 1 | 0 | 0 | 0 | 0 | 0 | 0 | 0 |
| Cycle 9: 2048-2303 | 1 | 1 | 1 | 1 | 1 | 1 | 1 | 1 | 0 | 0 | 0 | 0 | 0 | 0 | 0 | 0 |
| Cycle 10: 2304-2559 | 1 | 1 | 1 | 1 | 1 | 1 | 1 | 0 | 0 | 0 | 0 | 0 | 0 | 0 | 0 | 0 |
| Cycle 11: 2560-2815 | 1 | 1 | 1 | 1 | 1 | 1 | 0 | 0 | 0 | 0 | 0 | 0 | 0 | 0 | 0 | 0 |
| Cycle 12: 2816-3071 | 1 | 1 | 1 | 1 | 1 | 0 | 0 | 0 | 0 | 0 | 0 | 0 | 0 | 0 | 0 | 0 |
| Cycle 13: 3072-3327 | 1 | 1 | 1 | 1 | 0 | 0 | 0 | 0 | 0 | 0 | 0 | 0 | 0 | 0 | 0 | 0 |
| Cycle 14: 3328-3583 | 1 | 1 | 1 | 0 | 0 | 0 | 0 | 0 | 0 | 0 | 0 | 0 | 0 | 0 | 0 | 0 |
| Cycle 15: 3584-3839 | 1 | 1 | 0 | 0 | 0 | 0 | 0 | 0 | 0 | 0 | 0 | 0 | 0 | 0 | 0 | 0 |
| Cycle 16: 3840-4095 | 1 | 0 | 0 | 0 | 0 | 0 | 0 | 0 | 0 | 0 | 0 | 0 | 0 | 0 | 0 | 0 |
| Cycle 17: 4096-4351 | 0 | 0 | 0 | 0 | 0 | 0 | 0 | 0 | 0 | 0 | 0 | 0 | 0 | 0 | 0 | 0 |

*FIG. 13*

SYSTEMS AND METHODS FOR COUNTING PROGRAM-ERASE CYCLES OF A CELL BLOCK IN A MEMORY SYSTEM

TECHNICAL FIELD

This disclosure relates to non-volatile memory storage systems in solid-state drives or other devices, including but not limited to flash drives or embedded/removable flash packages. More specifically, this disclosure relates to systems and methods for storing program-erase cycles in a location(s) a memory system other than user data.

BACKGROUND

Semiconductor memory is widely used in various electronic devices such as cellular telephones, digital cameras, personal digital assistants, medical electronics, mobile computing devices, and non-mobile computing devices. Semiconductor memory may include non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and electrically erasable programmable read-only memory (EEPROM).

When a memory system is deployed in an electronic device, the memory system may program data, store data, read data and/or erase data. In some types of memory, cell characteristics of memory cells degrade with use so that memory cells tend to wear out after a certain amount of use (e.g. after being written a certain number of times). Different types of memories can have different wear-out characteristics and different memory access patterns can cause different patterns of wear. Wear leveling may be used to distribute wear across memory cells so that wear is not concentrated on particular memory cells, which could lead to early failure of such memory cells.

In current NAND solid-state drive (SSD) technology, the memory system monitors the cycling count of blocks of memory cells, and a wear leveling algorithm monitors all blocks have similar program-erase (P/E) cycles counts. Additionally, current NAND SSD technology tracks P/E cycle counts inside an SSD controller, such as static random-access memory (SRAM) or dynamic random-access memory (DRAM). Therefore, the P/E cycle count information is either inside the SRAM or DRAM, which can occupy a relatively high amount space in the memory system. In order to save SRAM/DRAM space, P/E cycle counts are either logged discretely (e.g., cycle 0, cycle 100, cycle 200, etc.) or logged for across each plane of the memory system. In both cases, the accuracy and granularity are highly compromised.

In case of power loss, the SSD will move controller information into NAND using the on-chip capacitor energy. Therefore, it consumes capacitor energy credit.

SUMMARY

Various embodiments are described herein for storing program-erase cycling counts a nonvolatile memory, e.g., a NAND. A memory can include a memory control circuitry and a plurality of memory cells to store data.

An aspect of the present disclosure is related to a method for managing a program-erase cycle count of a memory block in a memory system that includes a step of obtaining a number. The number may include a random number. The method continues with comparing the obtained number with a predetermined number. When the obtained number is equal to the predetermined number, updating a bit of a plurality of program-erase bits. A controller, including but not limited to a SSD controller, is used to carry out the steps.

In an embodiment, updating the bit includes updating a drain select gate (SGD) bit.

In an embodiment, the bit establishes a first cycling bit of the plurality of program-erase cycling bits, the first cycling bit representing a first range of program-erase cycle counts for the cell block, the plurality of program-erase cycling bits includes a second cycling bit that represents a second range of program-erase cycle counts for the cell block, and the first range does not overlap with the second range.

In an embodiment, updating the plurality of program-erase cycling bits includes increasing the program-erase cycle count from the first range to the second range.

In an embodiment, updating the bit includes updating a rightmost non-zero bit of the plurality of program-erase cycling bits from "1" to "0".

In an embodiment, storing the plurality of program-erase cycle bits occurs at a location other than user data cell blocks of the memory system.

In an embodiment, subsequent to updating the cycling bit, the data is erased data from the cell block.

According to another aspect of the disclosure, a memory system for managing a program-erase cycle count of a cell block in a memory system is provided. The memory system is configured to obtain a number, compare the obtained number with a predetermined number, and when the obtained number is equal to the predetermined number, update a bit of a plurality of program-erase cycling bits. A controller, including but not limited to a SSD controller, is used to carry out the steps.

In an embodiment, the update of the bit includes updating a drain select gate (SGD) bit.

In an embodiment, the bit establishes a first cycling bit of the plurality of program-erase cycling bits, the first cycling bit representing a first range of program-erase cycle counts for the cell block, the plurality of program-erase cycling bits includes a second cycling bit that represents a second range of program-erase cycle counts for the cell block, and the first range does not overlap with the second range.

In an embodiment, the update to the plurality of program-erase cycling bits includes an increase to the program-erase cycle count from the first range to the second range.

In an embodiment, the update to the cycling bit includes an update to a rightmost non-zero bit of the plurality of program-erase cycling bits from "1" to "0".

In an embodiment, the store of the plurality of program-erase cycle bits occurs at a location other than user data cell blocks of the memory system.

In an embodiment, subsequent to the update to the bit, the data is erased data from the cell block.

According to another aspect of the disclosure, non-volatile memory system includes a controller configured to obtain a number, compare the obtained number with a predetermined number; and when the obtained number is equal to the predetermined number, update a bit of a plurality of program-erase cycling bits.

In an embodiment, the update of the bit includes updating a drain select gate (SGD) bit.

In an embodiment, the bit establishes a first cycling bit of the plurality of program-erase cycling bits, the first cycling bit representing a first range of program-erase cycle counts for the cell block, the plurality of program-erase cycling bits includes a second cycling bit that represents a second range of program-erase cycle counts for the cell block, and the first range does not overlap with the second range.

In an embodiment, the update to the plurality of program-erase cycling bits includes increasing the program-erase cycle count from the first range to the second range.

In an embodiment, the update to the cycling bit includes updating a rightmost non-zero bit of the plurality of program-erase cycling bits from "1" to "0".

In an embodiment, the store of the plurality of program-erase cycle bits occurs at a location other than user data cell blocks of the memory system.

In an embodiment, subsequent to the update to the cycling bit, the data is erased data from the cell block.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 13 depicts the information store shown in FIG. 12, along with various program scenarios.

DETAILED DESCRIPTION

Figure 1:
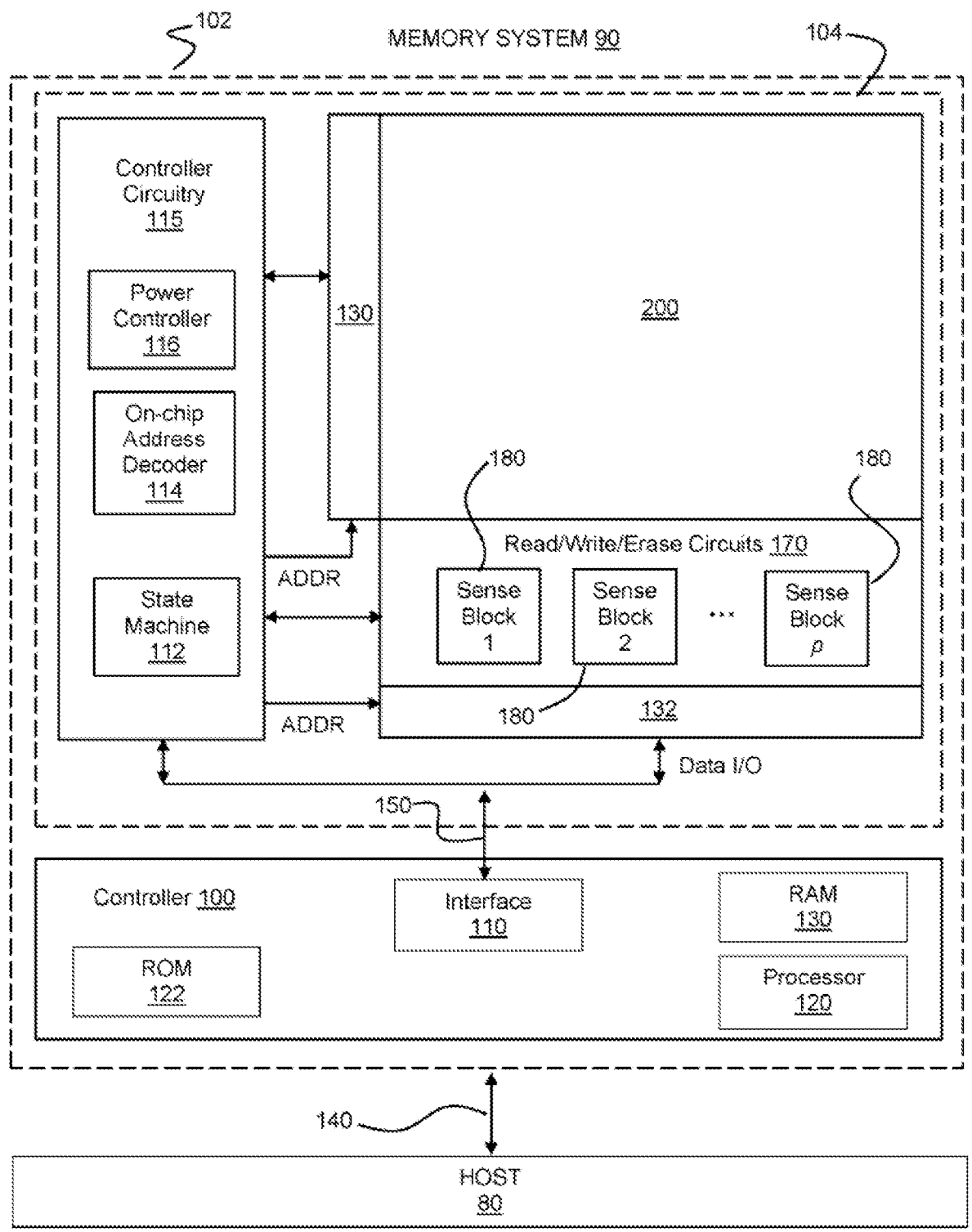
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may include a segment of executable code constituting one or more physical or logical blocks of computer instructions that translate into an object, process, or function. Also, it is not required that the executable portions of such a module be physically located together, but rather, may include disparate instructions that are stored in different locations and which, when executed together, include the identified module and achieve the stated purpose of that module. The executable code may include just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electro-magnetic, infrared, or semiconductor-based system, apparatus, or device, or any suitable combination thereof. In general, for purposes of the present disclosure, a computer-readable and/or executable storage medium may include any tangible and/or non-transitory medium that is capable of containing and/or storing a program for use by or in connection with an instruction execution system, apparatus, processor, or device.

Similarly, for the purposes of the present disclosure, the term "component" may include of any tangible, physical, and non-transitory device. For example, a component may be in the form of a hardware logic circuit that includes customized VLSI circuits, gate arrays, or other integrated circuits, or is includes off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may include of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may include a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may include one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may include a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may include one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as including individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 includes a memory device 102 whose operations are controlled by a controller 100. The host device 80 may include any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters into which a memory card is plugged.

Still referring to FIG. 1, as described in detail below, the memory device 102 may include one or more memory arrays 200 of a plurality of non-volatile memory cells that are distributed over one or more integrated circuit chips. And, in accordance with this particular embodiment, the controller 100 may include several components including, but not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
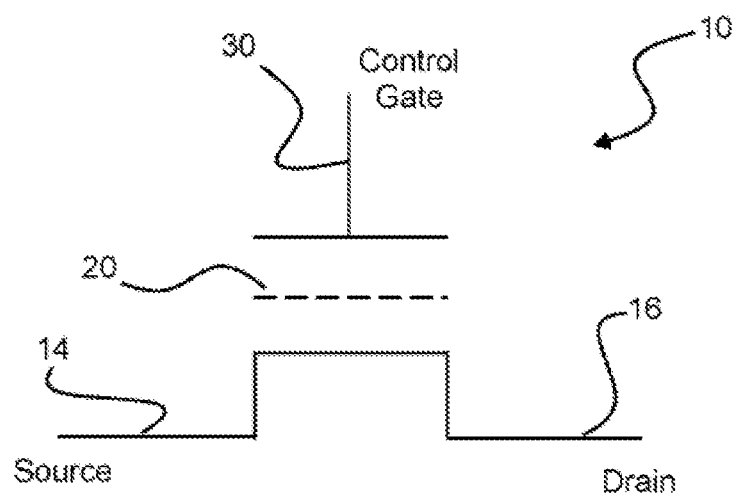
FIG. 2 schematically depicts a non-volatile memory cell, in accordance with exemplary embodiments.

With respect to the one or more memory arrays 200, FIG. 2 is a schematic depiction of an individual non-volatile memory cell 10 in accordance with an exemplary embodiment. As is mentioned above, the non-volatile memory cell 10 may be implemented by a field-effect transistor having a charge storage unit 20, such as a floating gate or a dielectric layer. In addition, the non-volatile memory cell 10 includes a source region 14 and a drain region 16. Further, a control gate 30 is positioned above the charge storage unit 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across respective electrodes at the source region 14 and drain region 16 when a reference voltage is applied to the control gate 30. More specifically, for each given charge on the charge storage unit 20 of the non-volatile memory cell 10, a corresponding conduction current with respect to a fixed reference control gate voltage may be detected. Accordingly, as is described above, the range of charges programmable onto the charge storage unit 20 defines a corresponding threshold voltage window or a corresponding conduction current window of the non-volatile memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3:
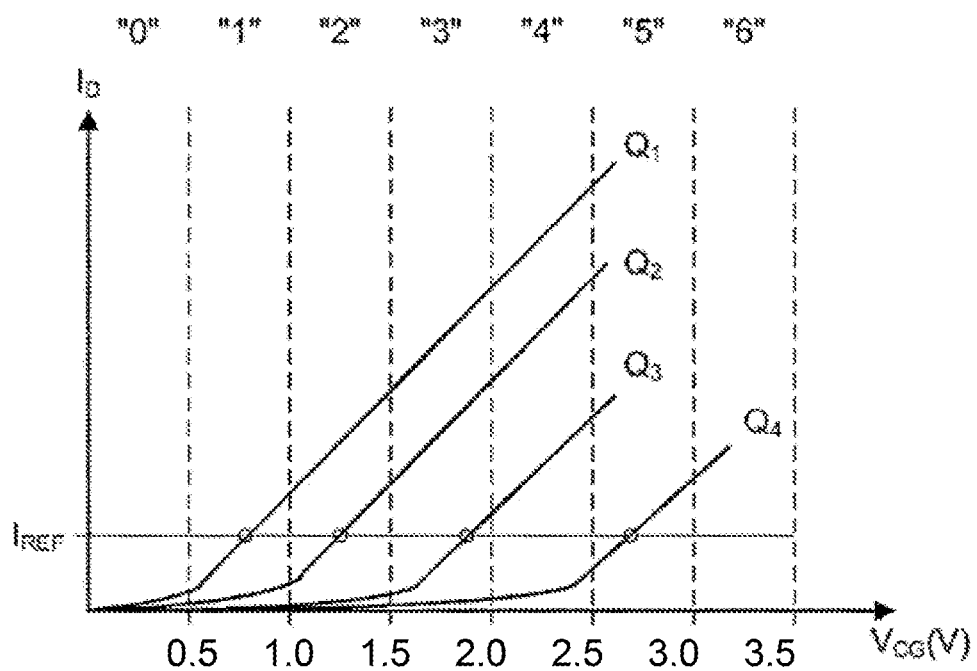
FIG. 3 depicts the relationship between a source-drain current ID and a control gate voltage $V_{CG}$ for four different charges Q1-Q4 that a floating gate of a non-volatile memory cell may be selectively storing at any one time at a fixed drain voltage, in accordance with exemplary embodiments.

FIG. 3 provides a graphical illustration of the correlation between the source-drain current ID and control gate voltage $V_{CG}$ for, for example, the non-volatile memory cell 10 (shown in FIG. 2) having four different charge states Q1-Q4 that the charge storage unit 20 (shown in FIG. 2) may be selectively storing at any given time. As shown, with a fixed drain voltage bias, there exists four solid ID versus $V_{CG}$ curves representing four charge levels (or states) that can be programmed onto the charge storage unit 20 of the non-volatile memory cell 10, wherein the four charge levels respectively correspond to four of eight possible memory states. Therefore, as an example, the threshold voltage ($V_{th}$) window of a population of memory cells may range from 0.5 V to 3.5 V. In such an example, seven programmed memory states assigned as "0," "1," "2," "3," "4," "5," and "6," respectively, and one erased state (not shown in FIG. 3), may be demarcated by partitioning the threshold voltage ($V_{th}$) window into regions at intervals of 0.5 V each. Accordingly, if a reference current $I_{REF}$, of 2 µA is used as depicted, then a memory cell that is programmed with Q1 voltage may be considered to be in a memory state "1" as its curve intersects with $I_{REF}$ in the region of the threshold voltage ($V_{th}$) window that is demarcated by the voltage range VCG=0.5 V and 1.0 V. Similarly, Q4 is in a memory state "5."

Thus, as mentioned above, the more states that a memory cell 10 is made to store, the more finely divided is its threshold voltage ($V_{th}$) window. For example, in a memory cell 10 that has a threshold voltage ($V_{th}$) window ranging from −1.5 V to 5 V, thereby providing a possible maximum width (or distribution) of 6.5 V, and is to store 16 memory states, each memory state may only occupy a voltage range of from 200 mV to 300 mV. However, such a narrow voltage range will require higher precision in both the programming and reading operations in order to achieve the required resolution.

Figure 4A:
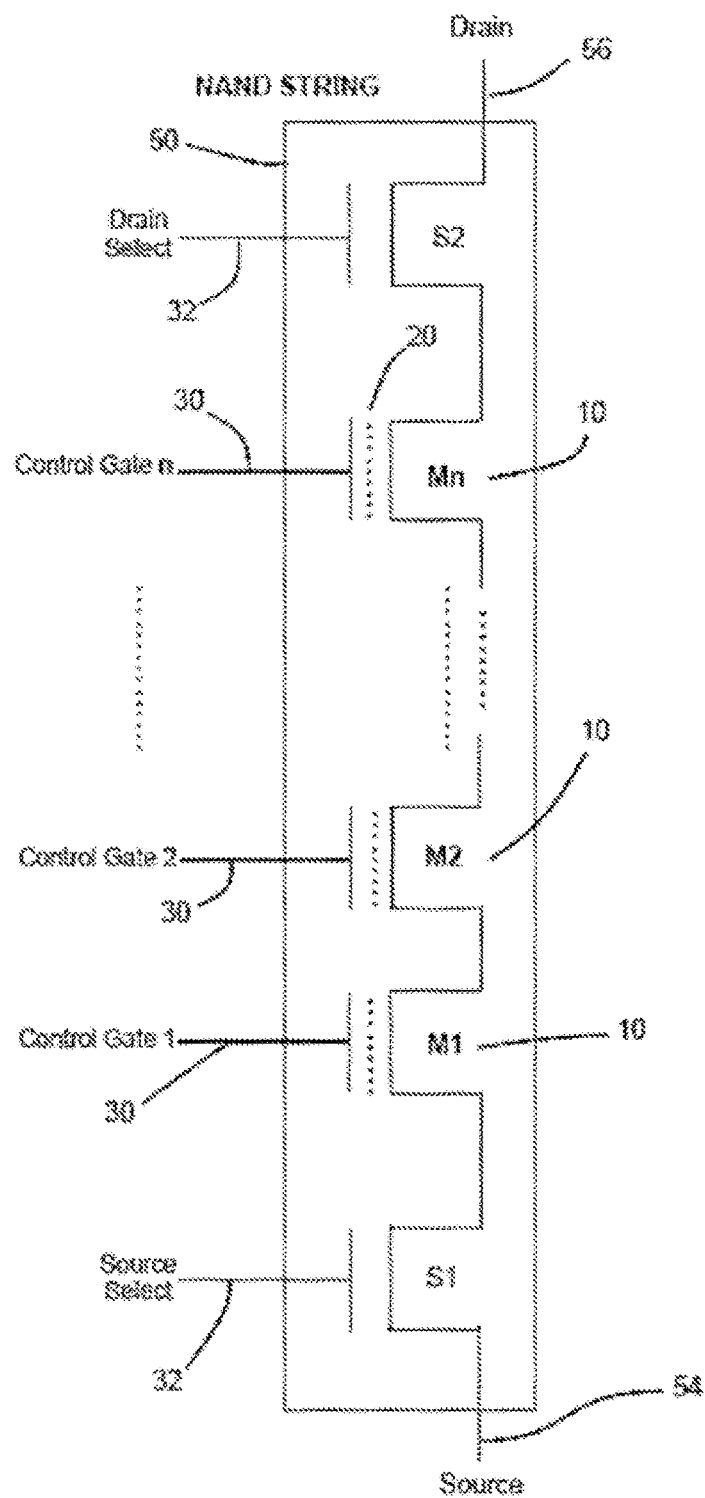
FIG. 4A schematically depicts a series of NAND-type memory cells organized into a string, in accordance with exemplary embodiments.

According to certain exemplary embodiments, the individual memory cells 10 are organized into in which the memory cells are placed in series. For example, depicted in FIG. 4A is an exemplary embodiment of a string 50 including NAND-type memory cells placed in series in which the transistor elements, i.e., M1, M2, . . . , Mn (wherein "n" may equal 4, 8, 16, or higher), are daisy-chained with respect to their sources and drains. In this regard, the string 50 includes a source terminal 54 and a drain terminal 56. Further, as discussed above with respect to FIG. 2, each memory cell 10 (defining a memory string) in the string 50 has a charge storage unit 20 (e.g., a floating gate) for storing a certain amount of electron charge therein so as to represent an intended memory state of that cell. Also, each memory cell 10 includes a control gate 30 that allows control over the read and the write memory operations. Present at the source terminal 54 and the drain terminal 56 of the string 50 are select transistors S1, S2 that control the transistor's connection to the outlaying memory array. Specifically, when the source select transistor S1 is turned on, the source terminal 54 of string 50 is coupled to a source line (SL). Likewise, when the drain select transistor S2 is turned on, the drain terminal 56 of string 50 is coupled to a bit line (BL) of the memory array. The source line (SL) and bit line (BL) will be shown below.

Figure 4B:
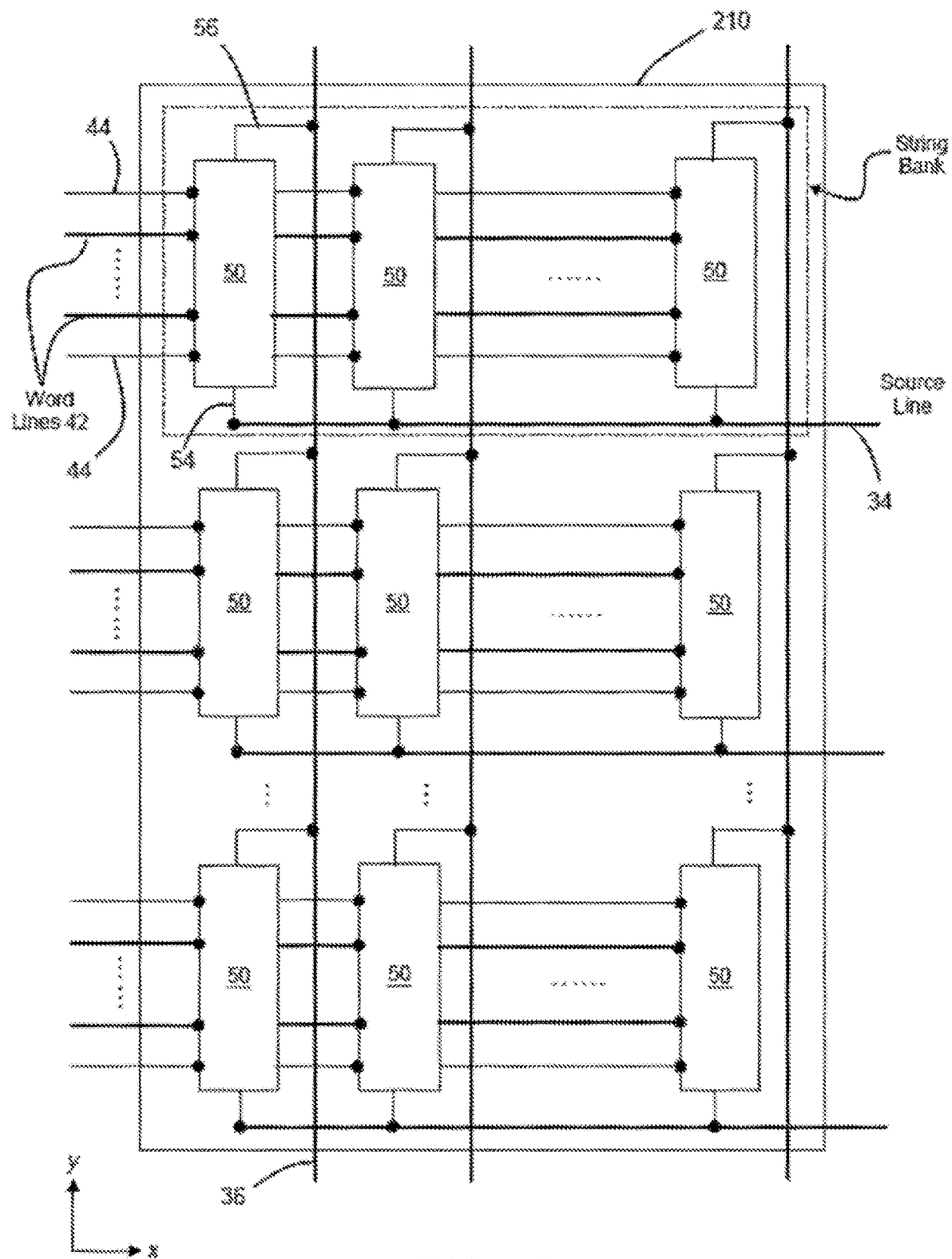
FIG. 4B schematically depicts a two-dimensional array of memory cells, including a plurality of NAND-type strings, such as the type depicted in FIG. 4A, in accordance with exemplary embodiments.

FIG. 4B is a schematic diagram depicting an exemplary embodiment of a memory array 210. The memory array 200 (shown in FIG. 1) may include any features described herein for the memory array 210. The memory array 210 may include strings 50 (i.e., NAND strings) of the type illustrated in FIG. 4A. Along each column of strings 50, a bit line (BL) 36 is coupled to the drain terminal 56 of each NAND string 50. In addition, along each bank of strings 50, a source line (SL) 34 is coupled to the source terminals 54 of each NAND string 50. Further, the control gates 30 of the memory cell 10 (shown in FIG. 4A) in a row of memory cells in the bank of NAND strings 50 are connected to the same word line (WL) 42. Accordingly, during a programming operation, when an addressed memory cell 10 within a string 50 is read or verified, an appropriate voltage is applied to its control gate 30. Concurrently, the remaining non-addressed memory cells 10 within the string 50 are fully turned on by applying a sufficient voltage to their respective control gates 30. As a result, an electrically conductive pathway is created from the source of the addressed memory cell 10 to the source terminal 54 of the string 50, and from the drain of the addressed memory cell 10 to the drain terminal 56 of the cell string 50.

Further, the control gates 32 of the select transistors S1, S2 (show in FIG. 4A) of each string 50 in the memory array 210 provide control access to the string 50 at its source terminal 54 and drain terminal 56. The control gates 32 of the select transistors S1, S2 along a row in a bank of strings 50 are connected to the same select line 44. Thus, an entire row of memory cells 10 in a bank of strings 50 can be addressed by applying the appropriate voltages on the word lines (WL) 42 and select lines 44 of the bank of strings 50.

Figure 5:
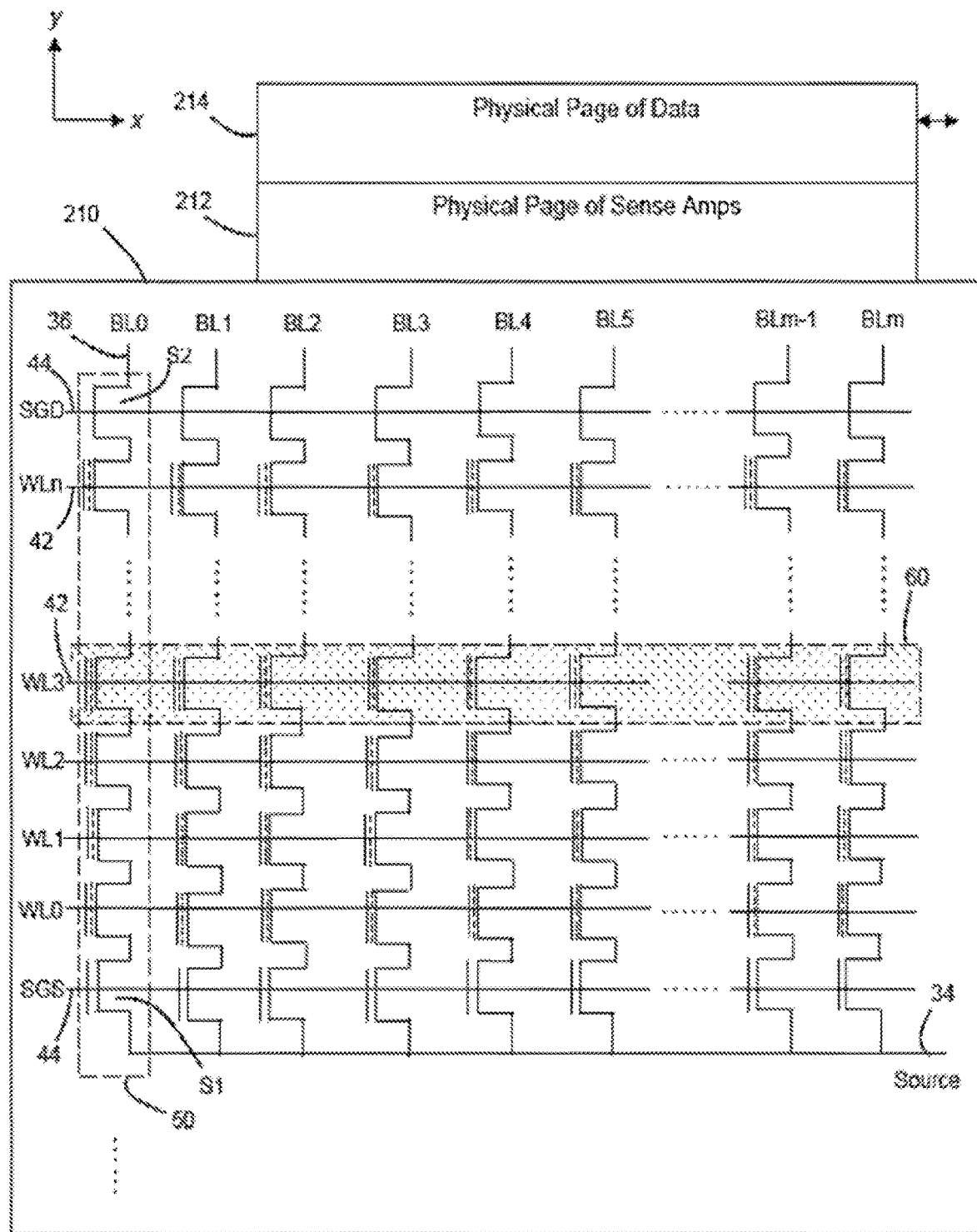
FIG. 5 depicts a page of memory cells being sensed or programmed in parallel, and in relation to a memory array organized in a NAND-type configuration, in accordance with exemplary embodiments.

FIG. 5 depicts a detailed illustration of a bank of strings 50 of a memory array 210 according to an exemplary embodiment thereof. This view is particularly useful in visualizing a row-by-row configuration of the memory array 210, wherein each row may be referred to as a physical "page." Accordingly, a physical page (e.g., page 60 denoted in FIG. 5) is a group of memory cells 10 that is enabled to be sensed or programmed in parallel. In such a configuration, a page is the smallest unit of the memory device that may be programmed or written to. Programming of a page is accomplished by a corresponding page of sense amplifiers (SA) 212, wherein each sense amplifier may be coupled to a respective string 50 via a bit line (BL) (see e.g., the bit lines BL0, BL1, BL2, . . . , BLm−1, and BLm, as depicted in FIG. 5). Thus, a page 60 is enabled by the control gates of the memory cells 10 in a page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a charge storage unit 20 (shown in FIG. 2) must first be emptied of charge, thereby placing the memory cell in an erased state, before a programming operation can subsequently add a desired amount of charge back to the charge storage unit 20. Thus, the level of charge on a charge storage unit 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of a memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 6:
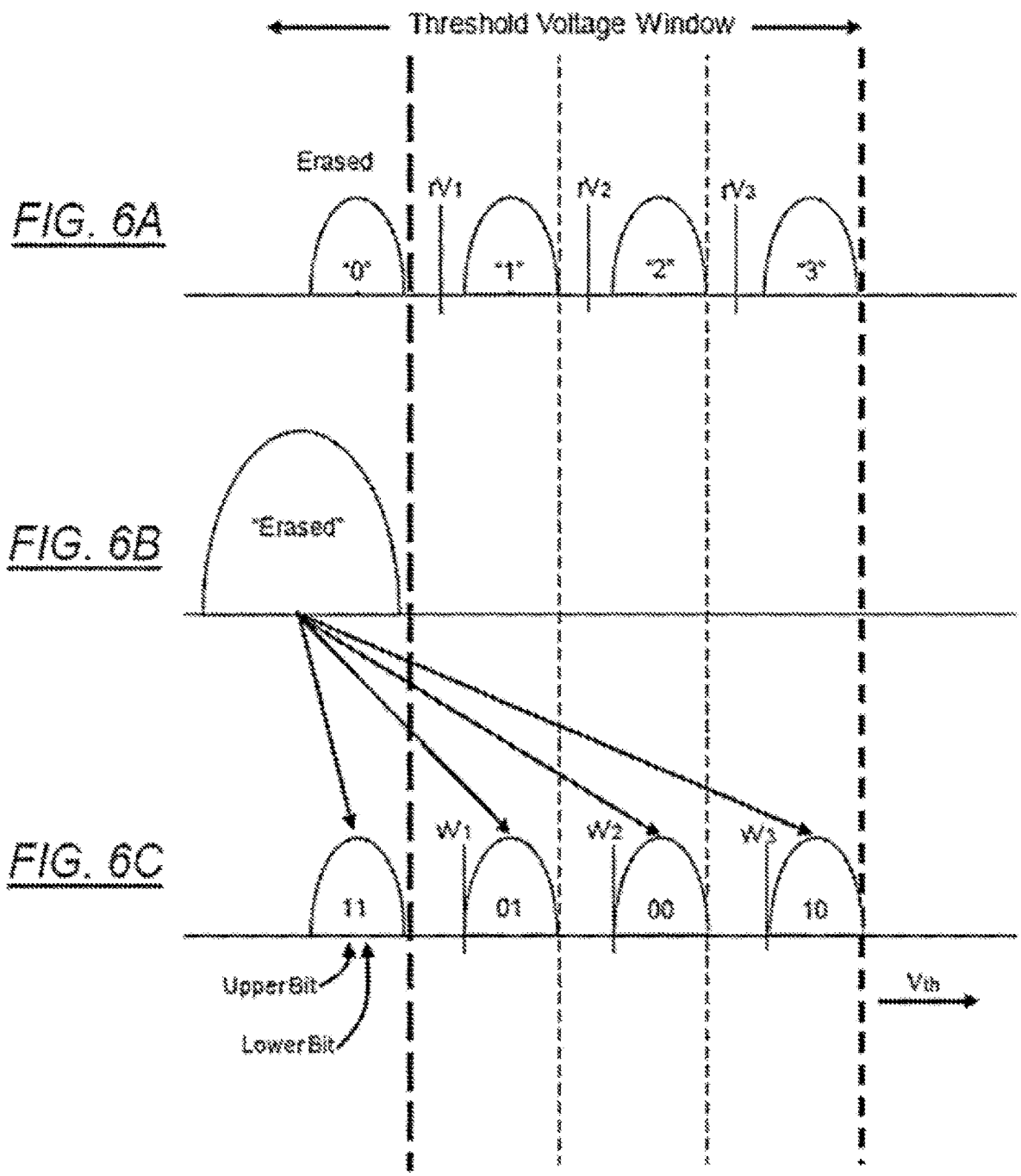
FIG. 6A-C depict stages of programming four states of a population of MLC-type memory cells, in accordance with exemplary embodiments.

To illustrate an exemplary embodiment of the programming stages of, for example, a MLC memory device that includes a population of four-state memory cells, reference is made to FIGS. 6A-C. In FIG. 6A, there is depicted a population of memory cells in which the characteristic threshold voltage ($V_{th}$) window is divided into four distinct voltage distributions, with each distribution corresponding to a programmable memory state (i.e., memory states "0," "1," "2," and "3"). FIG. 6B illustrates an initial distribution of "erased" threshold voltages ($V_{th}$) for an erased memory. In FIG. 6C, much of the memory cell population has been programmed such that the initial "erased" threshold voltage of a given memory cell 10 is moved to a higher value into one of the three divided voltage zones that are demarcated by verify levels $vV_1$, $vV_2$, and $vV_3$. Accordingly, each memory cell can be programmed to one of the three programmable states "1," "2," and "3," or remain in the "erased" state. On a bit level, a two-bit code having, for example, a lower bit and upper bit can be used to represent each of the four memory states. For example, as depicted in FIG. 6C, the memory states "0," "1," "2," and "3" may be assigned bit values "11," "01," "00," and "10," respectively. In such example, the two-bit data may be read from the memory by sensing in a "full-sequence" mode in which the two bits are, for example, sensed together by sensing relative to the corresponding read demarcation threshold voltages—$rV_1$, $rV_2$, and $rV_3$—in three sub-passes respectively.

Figure 7:
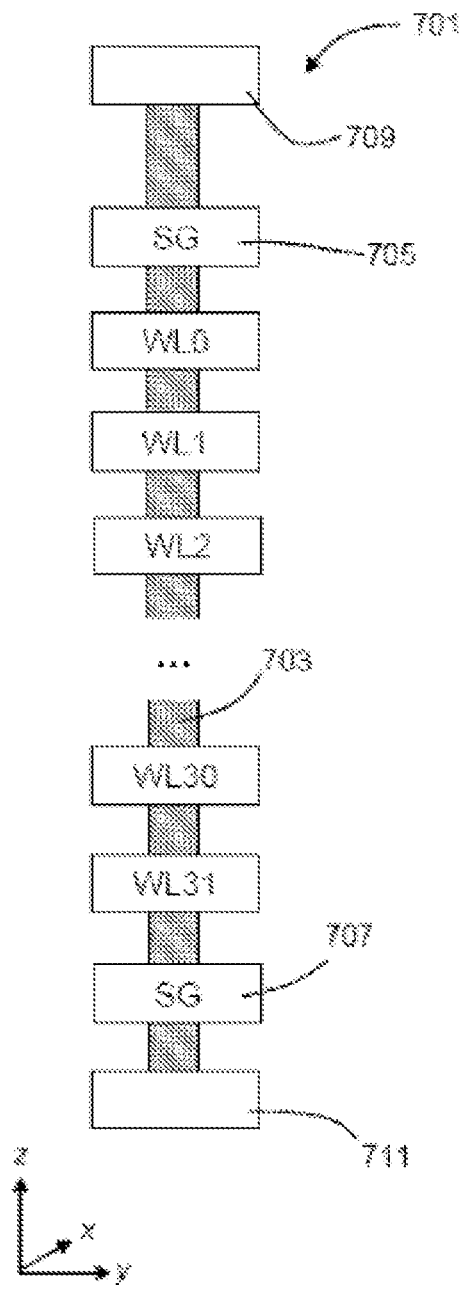
FIG. 7 depicts a vertical NAND-type string of a three-dimensional memory array, in accordance with exemplary embodiments.

In FIGS. 4A-B and 5 and the foregoing corresponding description, there is generally described a two-dimensional (or planar) memory array 210 (lying in a x-y plane, for example), which may include NAND-type memory cells. However, in an alternative configuration, a memory array may be in the form of a three-dimensional array that, unlike being formed on a planar surface of a semiconductor wafer, the array extends upwards from the wafer surface and includes stacks or columns of memory cells extending vertically in an upwards direction (for example, in a z direction that is perpendicular to the x-y plane). As a result, three-dimensional memory structures increase the storage density but consume less chip surface. For example, FIG. 7 depicts an exemplary embodiment of a 3D NAND-type string 701, which is operated in a similar manner as a two-dimensional NAND-type string, such as the string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the 3D NAND-type string 701 are select gates 705, 707, which allow for the selective connection to, or isolation from, external elements 709, 711 that include, for example, conductive lines (such as common source lines or bit lines) that serve large numbers of strings of a memory array. In the particular embodiment shown in FIG. 7, the 3D NAND-type string 701 (a vertical string) has 32 memory cells (i.e., at the juncture between the bit line 703 and word lines 0 (WL0) through 31 (WL31)) that are connected in series. However, the 3D NAND-type string 701 may include any suitable number of memory cells.

Referring back to the overall architecture of a memory system that is, for example, depicted in FIG. 1, there is shown a schematic depiction of a typical arrangement of an example memory device 102. In this particular embodiment, the memory device 102 includes one or more memory die 104. Also, the one or more memory arrays 200 (included in the one or more memory die) may include a two- or three-dimensional memory structure, such as the two- and three-dimensional memory arrays described above with respect to FIGS. 4A-B through FIG. 7, as well as the associated control circuitry 115 and read/write/erase circuits 170. For example, the one or more memory arrays 200 may include a monolithic three-dimensional memory structure in which multiple memory levels are formed above (rather than in) a single substrate, such as a wafer, without any intervening substrates. Further, the one or more memory arrays 200 may include any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the one or more memory arrays 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 includes multiple sense blocks 180 (Sense Block 1, Sense Block 2, . . . , Sense Block p) that are connectable via bit lines to the memory elements of the one or more memory arrays 200. The sense blocks 180 allow memory cells connected to a common word line (referred to as a "page" of memory cells) to be read or programmed in parallel. In some embodiments, a controller 100 is included in the memory device 102 as the one or more memory die 104. In other embodiments, the controller 100 may be located separate from the one or more memory die 104. In some embodiments, the controller 100 may be on an entirely different die from the one or more memory die 104. Further, in certain embodiments, each of the one or more memory die 104 may have its own controller 100 or, in other embodiments, a controller 100 may communicate amongst the one or more memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the one or more memory die 104 includes input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host 80 provides a logical address to which data is to be read/written, the controller 100 can convert the logical address received from the host to a physical address in the memory. Alternatively, the host 80 can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may include an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for the controller 100 to perform the desired functions.

Additionally, the control circuitry 115 cooperates with the read/write/erase circuits 170 in performing memory operations (e.g., read, program, erase, etc.) with respect to the one or more memory arrays 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by the row and column decoders 130, 132. The power control module 116 controls the power and voltages that are supplied to the word lines and bit lines during memory operations. As such, the power control module 116 may include drivers for word line layers (with respect to a 3D memory configuration), select transistors, and source lines. Also, the power control module 116 may include charge pumps for generating voltages. The sense blocks 180 may include the bit line drivers. Any one or any combination of the control circuitry 115, the state machine 112, the decoders 114/130/132, power control module 116, sense blocks 180, read/write/erase circuits 170, and/or controller 100 can be considered a control circuit that performs at least some functions described herein.

As described above, memory cells of the one or more memory arrays 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, the one or more memory arrays 200, as a three-dimensional memory structure, may be vertically arranged as a stack of multiple two-dimensional memory array device levels. In other exemplary embodiments, the one or more memory arrays 200, as a three-dimensional memory structure, is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as the string 50 and memory array 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 8:
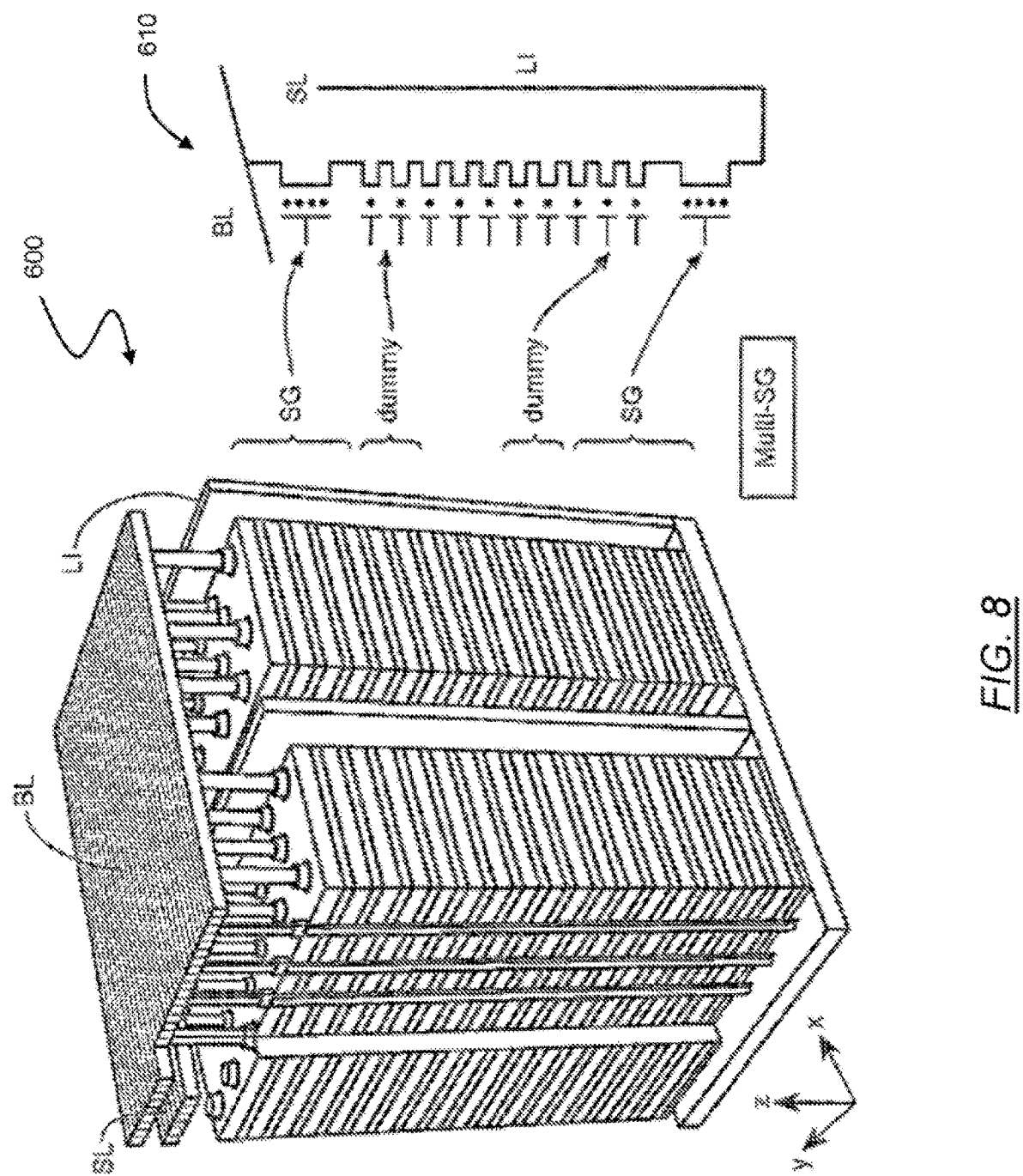
FIG. 8 is a perspective view of a representative subsection of a monolithic three-dimensional NAND-type memory array, in accordance with exemplary embodiments.

Referring now to FIG. 8, there is depicted an oblique perspective view of an example subsection of an embodiment of a 3D NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the 3D NAND memory array 600, the NAND strings are connected along global bit lines (BL) that span multiple of these subsections of the 3D NAND memory array 600 that run in the x-direction. In addition, global common source lines (SL) also run across multiple subsections of the 3D NAND memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the 3D NAND memory array 600. FIG. 8 further depicts a vertical NAND string 610 (representative of additional vertical NAND strings) of the 3D NAND memory array 600. Similar to the string 50 of FIG. 4A, the vertical NAND string 610 includes a series of interconnected memory cells. The vertical NAND string 610 is connected to an associated bit line (BL) through a drain select gate (SGD). A source select gate (SGS) connects the vertical NAND string 610 to a global source line (SL) through an associated local source line (LI). Further included in this particular embodiment are several dummy cells located at the ends of the string 610. Due to their proximity to select gates (SGD, SGS) and, thereby, their susceptibility to disturbs, the dummy cells are not used to store user data.

Figure 9:
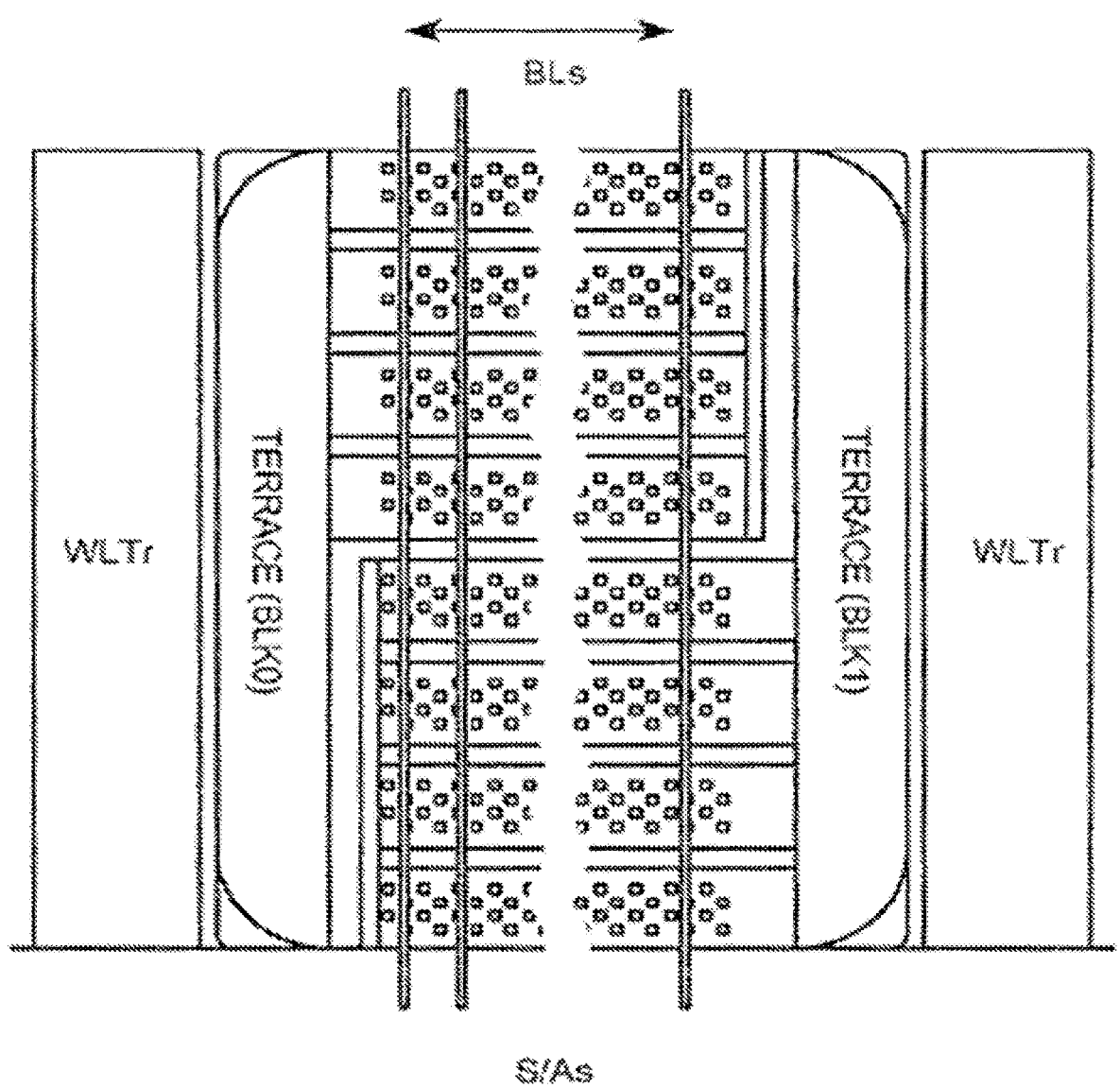
FIG. 9 is a top view of two representative blocks of the memory array of FIG. 8, in accordance with exemplary embodiments.

Turning to FIG. 9, there is shown a top view of two representative blocks (i.e., BLK0 and BLK1) of the 3D NAND memory array 600 of FIG. 8. According to this particular embodiment, each block includes four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

Figure 10:
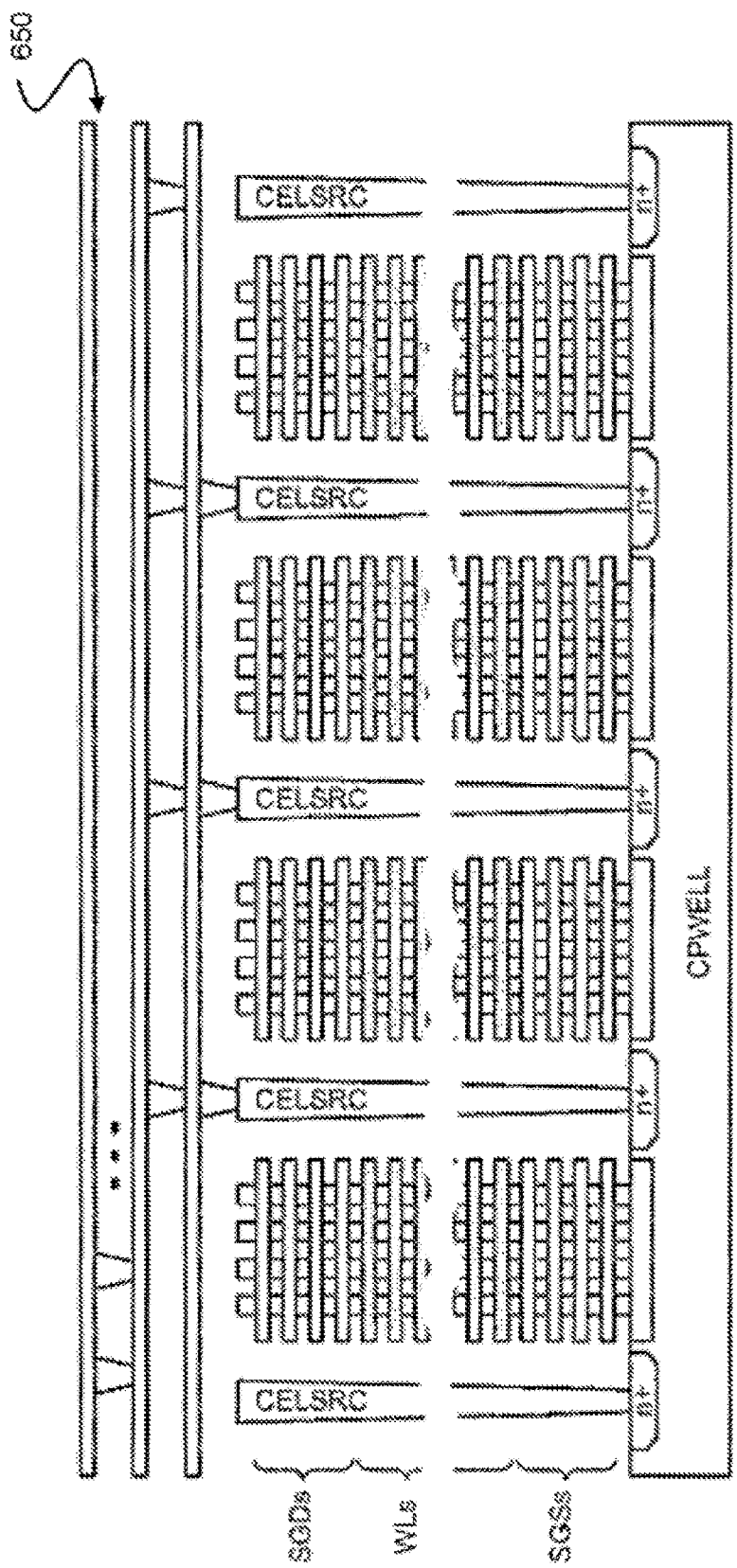
FIG. 10 is a side view of a representative block of the memory array of FIG. 8, in accordance with exemplary embodiments.

The side view that is provided in FIG. 10 shows the four extensions of an individual block 650 of the 3D NAND memory array 600 of FIG. 8 in greater detail. According to this particular embodiment, select gates (SGD, SGS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Different types of non-volatile memory may have very different media properties, including endurance characteristics and may have different likely failure modes. For example, block-erasable memories may use logical-to-physical mapping to accommodate writing the same data to different locations (e.g. when data is updated it may be written in a new block). A wear leveling scheme may remap data from a heavily worn block in such a memory and write-erase cycles may be counted on a block-by-block basis. Certain types of non-volatile memory do not require an erase between writes (previous data may be overwritten) and may be considered write-in-place memories. Some write-in-place memories are proposed as candidates to replace DRAM main memory in some processing systems because of their high read and write speeds and may be referred to as "storage class memory" or SCM. Unlike DRAM, such memories retain data when power is lost and may also be referred to as "persistent memory." ReRAM, MRAM, and Phase Change Memory (PCM) may be considered persistent memory examples and may be considered as SCM. Some forms of SCM may have relatively low endurance compared to DRAM. While overwriting old data with corresponding replacement data allows fast writing and simplifies memory management, if particular data is frequently updated, a corresponding physical area may become worn rapidly. Thus, wear leveling for write-in-place memories poses particular challenges. While aspects of the present technology are described with respect to write-in-place memories, it will be understood that the present technology is applicable to any suitable memory and is not limited to write-in-place.

Figure 11:
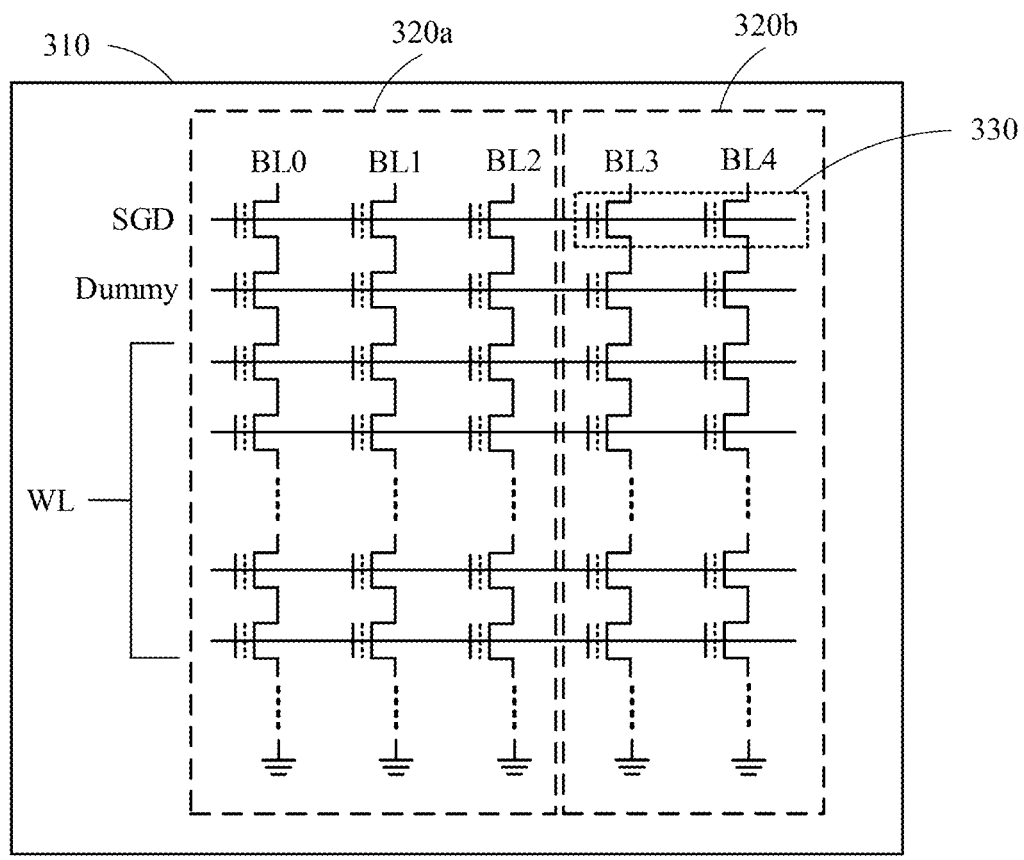
FIG. 11 depicts an embodiment of a memory array 310, in accordance with exemplary embodiments.

FIG. 11 depicts an embodiment of a memory array 310, in accordance with exemplary embodiments. The memory array 310 may include several features shown and described herein for a memory array. In this regard, the features shown and described in the memory array 310 may be integrated/incorporated into one or more memory arrays 200 of the memory device 102 (shown in FIG. 1). The memory array 310 may include multiple NAND-type memory cells, established by respective transistors, placed in series. The memory array 310 further includes multiple strings of bit lines, including BL0, BL1, BL2, BL3, and BL4, with each string of bit lines having multiple memory cells. Although not shown, additional bit lines may be present in the memory array. Additionally, the memory array 310 includes a drain select gate (SGD) line, representing control gate on each of respective bit line strings BL0 through BL4, as well as multiple word lines (WL) separated from the drain select gate (SGD) by a dummy word line (Dummy). Collectively, the memory array 310 includes multiple memory cells established by a charge storage unit (e.g., floating gate).

The memory array 310 may include multiple sections, each of which can serve different purposes. For example, the memory array 310 includes a section 320a that includes memory cells associated with bit line strings BL0 through BL2 and the word lines (WL). The memory cells in the section 320a are used store user data, and accordingly, can be sensed/programmed and erased. Additionally, the memory array 310 includes a section 320b that includes memory cells associated with bit line strings BL3 and BL4, represented and the word lines (WL). The memory cells in the section 320b are used as spare columns, redundant columns, or column repairs, as non-limiting examples. In other words, the memory cells associated with bit line strings BL3 and BL4 and the word lines (WL) are not used to store user data. However, other useful information can be stored in the memory cells in the section 320b. For example, memory cells established by the drain select gate (SGD) line and bit line strings BL3 and BL4 can form an information store 330 used to store program-erase (P/E) cycles. In some embodiments, the information store 330 is a 2-byte information store 330, and accordingly, uses 16 bits to store information. Additionally, in some embodiments, the information store 330 use the dummy word line (Dummy) to store the P/E cycle count. Generally, the information store 330 can use available memory space other than memory space allotted for user data.

The information store 330 offers several advantages for memory systems. For example, the information store 330 will not be erased, and the bit designation increases with increasing P/E cycles for a memory block. As a result, the information store 330 will promote a counting operation. Additionally, the information store 330 is already part of the memory array 310. In other words, the information store 330 is not a newly-created set of memory cells added for managing and counting P/E cycles. Accordingly, procedures such as wear leveling (and associated wear leveling algorithms), can retrieve data from the information store 330, and use the data to determine, or at least approximate, the number of P/E cycles for a memory block, and determine whether to distribute program operations elsewhere. Also, by using the information store 330, the P/E cycle count is not subject to unwanted memory loss due to, for example, a power loss event.

Figure 12:
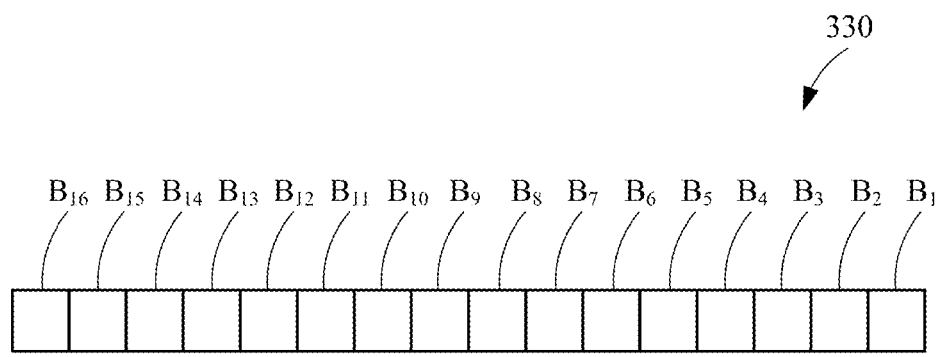
FIG. 12 depicts an exemplary embodiment of an information store 330, in accordance with exemplary embodiments.

FIG. 12 depicts an exemplary embodiment of an information store 330. The information store 330 is represented by a table that include cells $C_1$ through $C_{16}$. Each of the cells $C_1$ through $C_{16}$ of the information store 330 may include a bit of "1" (non-programmed) or a "0" (programmed). In this manner, each cell can be used to indicate a range of P/E cycles for a memory block, and each bit represents a program-erase bit. Collectively, the information store 330 represents a 16-bit readout, which corresponds to a particular range of P/E cycles. For example, when cells $C_1$ through $C_{16}$ each include a "1" bit, the memory block has undergone a number of P/E cycles within a first range. Similarly, when cells $C_2$ through $C_{16}$ each include a "1" bit and cell $C_1$ includes a "0" bit, the memory block has undergone a number of P/E cycles within a second range. The first and second ranges are different from each other. In particular, the first and second ranges may be non-overlapping ranges. Similar processes can continue until all cells $C_1$ through $C_{16}$ are programmed to a "0" bit, indicating the memory block has undergone highest range of P/E cycles.

FIG. 13 depicts the information store 330 and the various program scenarios. As shown, for 2-byte information available, the information store 330 represents up to 17 distinct ranges of P/E cycles counts, which each individual range corresponding to one of Cycles 1-17. Further, the interval range for the cycles may be selected based upon the desired number of P/E cycling counts to be monitored. For example, to monitor a memory block for 4,000 (4K) P/E cycles with 17 unique cycles, the interval range should be at least 235 cycle counts. In an example shown in FIG. 3, the interval range is selected as 256 P/E cycle counts. Accordingly, each cycle shown in FIG. 13 includes 256 numbers, e.g., Cycle 1 represents a range from 0 to 255 P/E cycle counts. It should be noted that the number of possible cycles may vary based upon the number of available bytes, and this should be construed as a non-limiting example.

Also, for each cycle increase, the rightmost non-zero bit (i.e., "1") is converted to "0" through a 1-bit program operation. This may occur by providing a program pulse (i.e., programming voltage, $V_{PGM}$) to the memory cell and biasing the rightmost non-zero bit to "0." Further, the information table 330, being stored in the drain select gate (SGD), is not erased during a P/E cycle of a memory block. Accordingly, a particular cycle (e.g., Cycle 5) will not restart back to Cycle 1, and the information store 330 will continue to provide the P/E cycle count for the memory block.

In order to determine a current P/E cycle count, a controller of a memory system (e.g., memory system 102) obtains a readout of the information store 300. If, for example, the 16-bit readout of the information store 330 corresponds to Cycle 8, the controller can determine the memory block has undergone approximately 2,000 P/E cycles, as Cycle 8 corresponds to, and includes, 1,792 to 2,047 P/E cycles. Conversely, if the 16-bit readout of the information store 330 corresponds to Cycle 16, the controller can determine the memory block has undergone approximately 4,000 P/E cycles, as Cycle 17 corresponds to, and includes, 3,840 to 4,095 P/E cycles. Accordingly, the information store 330 provides an approximation to the P/E cycle counts for a memory block. The process for updating the information store 330 is shown and described below.

Figure 14:
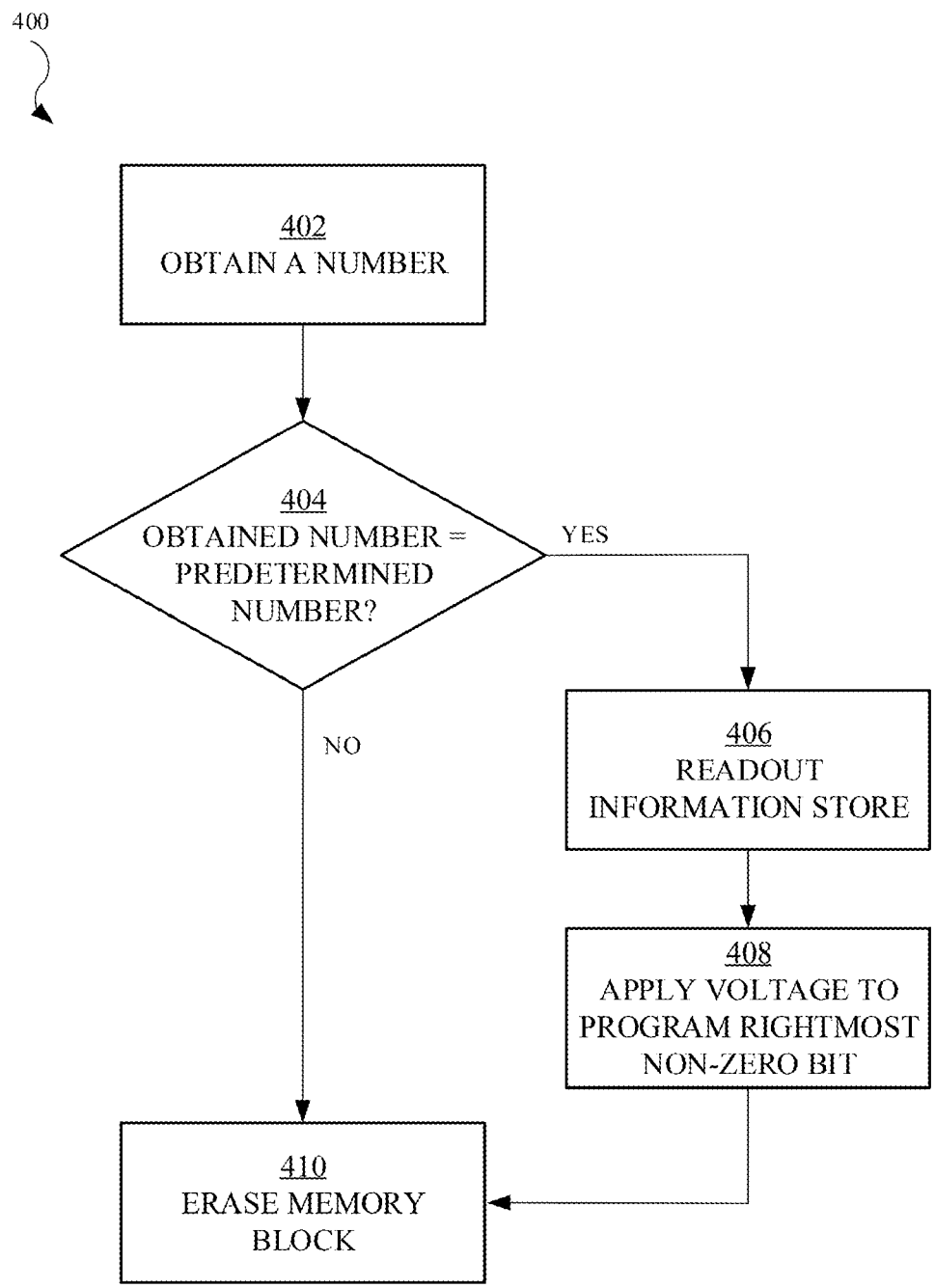
FIG. 14 depicts a process generally illustrating the steps for managing a program-erase cycle count of a cell block in a memory system.

FIG. 14 depicts a process 400 generally illustrating the steps for managing a program-erase cycle count of a cell block in a memory system. The process 400 shows and describes a manner in which a memory system (e.g., memory system 102 shown in FIG. 1) can manage and update P/E cycle counts for a memory block. Also, the process 400 describes an application for the managing and updating the information store 330 (shown in FIG. 13). Additionally, the steps shown and described may be performed by a controller (e.g., NAND controller).

At step 402, a number is obtained. In some embodiments, the number is a randomly generated number. The number, random or otherwise, can be generated by a controller (e.g., NAND controller) or received by the controller. In some embodiments, the range of numbers corresponds to the range of numbers for a given cycle of an information store (e.g., information store 330, shown in FIG. 13). For example, when the information store 330 is used and the range of numbers corresponds to Cycle 1, the obtained number can be any integer from 0 to 255. Further, for a given range of number, the obtained number has an equal probability of selection among the range of numbers. In other words, any number in the range has an equal probability of being selected. Accordingly, when the range of numbers is x, the probability of the obtained number is 1/x.

At step 404, the obtained number is compared with a predetermined number. In some embodiments, the predetermined number is set to the range value, i.e., the predetermined number is equal to the number of values with the range. For example, in FIG. 13, each range includes 256 numbers. Accordingly, the predetermined number in that example is 256. The statistical probability of the obtained valued, when randomly generated with equal probability, and equal to 256 of the obtained value being equal to the predetermined number (i.e., range number) is 1/256 (≈0.39%). In this regard, when the obtained number is 256, then statistically, the memory block has cycled 256 times.

If the obtained number is not equal to the predetermined number, the process 400 proceeds to step 410 and the memory block is erased. If the obtained number is equal to the predetermined number, the process 400 proceeds to step 406. At step 406, the information store is read out. When the information store is a 2-byte (16-bit) information store (e.g., information store 330 shown in FIG. 13), the information store is processed by the controller to determine the bit information. In particular, at step 406, the rightmost non-zero (i.e., "1" bit) is determined.

At step 408, a voltage is applied to program the rightmost non-zero bit to alter the rightmost non-zero bit from "1" to "0." When the information store is stored on the drain select gate (SGD), the rightmost non-zero bit line can be biased to 0 volts (V), and a programming voltage ($V_{PGM}$) is applied to the drain select gate (SGD). This process of programming the rightmost non-zero bit from "1" to "0" increases the approximated range of the P/E cycle count by 1. For example, in FIG. 13, when 16-bit readout of the information store 330 is in Cycle 9, the rightmost non-zero bit (at cell $C_{10}$)—indicating the P/E cycle was in the range of 2,048 to 2,303 P/E cycle counts—is altered from "1" to "0," the 16-bit readout of the information store 330 is subsequently in a state corresponding to Cycle 10.

At step 410, the memory block is erased. In some embodiments, the process 400 is performed prior to or during an erase operation (as opposed to a program operation), which can decrease the overall processing time.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for managing a program-erase cycle count of a memory block in a memory system, the method comprising:
by a controller:
obtaining a number within a quantity of values in each of a plurality of ranges of the program-erase cycle count;
comparing the obtained number with a predetermined number representing the quantity of values in each of the plurality of ranges of the program-erase cycle count; and
when the obtained number is equal to the predetermined number, updating a bit of a plurality of program-erase cycling bits.

2. The method of claim 1, wherein updating the bit comprises updating a drain select gate (SGD) bit.

3. The method according to claim 1, wherein:
the bit establishes a first cycling bit of the plurality of program-erase cycling bits, the first cycling bit representing a first range of program-erase cycle count for the memory block,
the plurality of program-erase cycling bits comprises a second cycling bit that represents a second range of program-erase cycle count for the memory block, and
the first range does not overlap with the second range.

4. The method according to claim 3, wherein updating the plurality of program-erase cycling bits comprises increasing the program-erase cycle count from the first range to the second range.

5. The method according to claim 1, wherein updating the bit comprises updating a rightmost non-zero bit of the plurality of program-erase cycling bits from "1" to "0".

6. The method according to claim 1, further comprising storing the plurality of program-erase cycling bits at a location other than user data cell blocks of the memory system.

7. The method according to claim 1, further comprising, subsequent to updating the bit, erasing data from the memory block.

8. A memory system for managing a program-erase cycle count of a memory block in a memory system, the memory system comprising:
a controller configured to:
obtain a number within a quantity of values in each of a plurality of ranges of the program-erase cycle count;
compare the obtained number with a predetermined number representing the quantity of values in each of the plurality of ranges of the program-erase cycle count; and
when the obtained number is equal to the predetermined number, update a bit of a plurality of program-erase cycling bits.

9. The memory system of claim 8, wherein updating the bit comprises updating a drain select gate (SGD) bit.

10. The memory system according to claim 8, wherein:
the bit establishes a first cycling bit of the plurality of program-erase cycling bits, the first cycling bit representing a first range of program-erase cycle count for the memory block,
the plurality of program-erase cycling bits comprises a second cycling bit that represents a second range of program-erase cycle count for the memory block, and
the first range does not overlap with the second range.

11. The memory system according to claim 10, wherein the update to plurality of program-erase cycling bits comprises an increase to the program-erase cycle count from the first range to the second range.

12. The memory system according to claim 8, wherein the update to the bit comprises an update to a rightmost non-zero bit of the plurality of program-erase cycling bits from "1" to "0".

13. The memory system according to claim 8, wherein the controller is further configured to store the plurality of program-erase cycling bits at a location other than user data cell blocks of the memory system.

14. The memory system according to claim 8, further comprising, subsequent to updating the bit, erasing data from the memory block.

15. A non-volatile memory system, comprising:
a controller configured to:
obtain a number within a quantity of values in each of a plurality of ranges of a program-erase cycle count of a memory block in the memory system;
compare the obtained number with a predetermined number representing the quantity of values in each of the plurality of ranges of the program-erase cycle count; and
when the obtained number is equal to the predetermined number, update a bit of a plurality of program-erase cycling bits.

16. The non-volatile memory system of claim 15, wherein updating the bit comprises updating a drain select gate (SGD) bit.

17. The non-volatile memory system according to claim 15, wherein:
the bit establishes a first cycling bit of the plurality of program-erase cycling bits, the first cycling bit representing a first range of program-erase cycle count for a memory block,
the plurality of program-erase cycling bits comprises a second cycling bit that represents a second range of program-erase cycle count for the memory block, and
the first range does not overlap with the second range.

18. The non-volatile memory system according to claim 17, wherein the update to plurality of program-erase cycling bits comprises an increase to the program-erase cycle count from the first range to the second range.

19. The non-volatile memory system according to claim 18, wherein the update to the bit comprises an update to a rightmost non-zero bit of the plurality of program-erase cycling bits from "1" to "0".

20. The non-volatile memory system according to claim 15, wherein the controller is further configured to store the plurality of program-erase cycling bits at a location other than user data cell blocks of the memory system.

* * * * *